United States Patent [19]

Bresee et al.

[11] E Re. 28,500

[45] Reissued July 29, 1975

[54] LOW NOISE FIELD EFFECT TRANSISTOR WITH CHANNEL HAVING SUBSURFACE PORTION OF HIGH CONDUCTIVITY

[75] Inventors: Heber J. Bresee, Campbell, Calif.; James L. Bowman, Portland, Oreg.

[73] Assignee: Tektronix, Inc., Beaverton, Oreg.

[22] Filed: Dec. 19, 1973

[21] Appl. No.: 426,259

Related U.S. Patent Documents

Reissue of:

[64] Patent No.: 3,656,031
Issued: Apr. 11, 1972
Appl. No.: 97,730
Filed: Dec. 14, 1970

[52] U.S. Cl. ..... 357/22; 357/21; 357/58; 357/52; 357/91

[51] Int. Cl. ..... H01l 5/00

[58] Field of Search ..... 317/235 A, 235 T, 235 AD, 317/235 AG; 357/21, 22, 13, 58, 52, 91

[56] References Cited

UNITED STATES PATENTS

| | | | |
|---|---|---|---|
| 3,268,374 | 8/1966 | Anderson | 148/175 |
| 3,316,131 | 4/1967 | Wisman | 148/175 |
| 3,409,812 | 11/1968 | Zuleeg | 317/235 |
| 3,413,531 | 11/1968 | Leith | 317/235 |
| 3,414,782 | 12/1968 | Lin et al. | 317/235 |
| 3,472,710 | 10/1969 | Welty | 148/175 |
| 3,653,978 | 4/1972 | Robinson et al. | 148/1.5 |
| 3,717,516 | 2/1973 | Hatcher et al. | 148/187 |

OTHER PUBLICATIONS

W. George, "Optim. of the Neutron Rad. Tol. of Junction Field Effect Trans.," IEEE Trans. on Nuc. Sc., Vol. NS-16, Dec. 1969, pp. 81-86

S. HSU, "Surface Related 1/f Noise in MOS Transistors," Solid State Electronics, Vol. 13, 1970, pp. 1451-1459.

*Primary Examiner*—Andrew J. James
*Assistant Examiner*—Joseph E. Clawson, Jr.
*Attorney, Agent, or Firm*—Klarquist, Sparkman, Campbell, Leigh, Hall & Whinston

[57] ABSTRACT

A PN junction gated field effect transistor is described in which the channel region is provided with a subsurface portion of higher conductivity than the outer surface of such channel at an intermediate position between the outer surface and the bottom of the channel in order to reduce the noise caused by surface recombination of current carriers and other surface effects, to about one-tenth its previous noise level. This subsurface portion of high conductivity is preferably formed by providing an oxide layer which, during diffusion of the channel, gathers the doping impurity from the surface of the channel to reduce the conductivity of such surface. A further method is to diffuse compensating impurities into the channel which invert the channel surface to an intrinsic material while leaving a subsurface portion of high conductivity.

10 Claims, 5 Drawing Figures

JAMES L. BOWMAN
HERBER J. BRESEE
INVENTORS.

BY

BUCKHORN, BLORE, KLARQUIST & SPARKMAN
ATTORNEYS

LOW NOISE FIELD EFFECT TRANSISTOR WITH CHANNEL HAVING SUBSURFACE PORTION OF HIGH CONDUCTIVITY

Matter enclosed in heavy brackets [ ] appears in the original patent but forms no part of this reissue specification; matter printed in italics indicates the additions made by reissue.

BACKGROUND OF THE INVENTION

The subject matter of the present invention relates generally to semiconductor electronic devices and, in particular, to field effect transistors of the PN junction gated type. The channel region of the field effect transistor is provided with a subsurface portion of high conductivity in order to reduce noise in the output signal of such transistor by minimizing surface effects including current carrier recombination of electrons and holes. Since most of the channel current flows through this subsurface portion, the surface defects do not cause as much recombination as with a conventional field effect transistor.

The field effect transistor of the present invention is especially suitable for use in an integrated circuit such as that shown in co-pending U.S. Pat. application, Ser. No. 697,055 filed Jan. 11, 1968, by H. J. Bresee, one of the joint inventors of the present invention. As shown in this pending application, the diffused channel portion of previous field effect transistors is provided with a doping impurity concentration having a maximum value at the surface of such channel and continuously decreasing to a minimum value at the bottom of the channel. This is the normal impurity concentration profile produced during diffusion of impurities into semiconductor material. Unfortunately, such a diffused channel has the disadvantage that the region of highest conductivity is at the surface of the channel so that much of the channel current flows through surface defects which act as recombination centers with the result that noise is produced in the output signal of the transistor due to recombination and other surface effects. This problem is avoided by the subsurface portion of high conductivity used in the channel of the present field effect transistor. Thus, such subsurface portion has peak value of conductivity of, for example, $9 \times 10^{+16}$ atoms per cubic centimeter, spaced below the surface of the channel, a distance of about 0.5 microns, and located at an intermediate position between the outer surface and the bottom of the channel. The impurity concentration of the channel decreases from such peak value to an outer surface concentration of, for example, $3 \times 10^{+16}$ atoms per cubic centimeter, and to a bottom gate junction concentration of, for example, $7 \times 10^{-15}$ atoms per cubic centimeter. As a result of providing this subsurface portion of highest conductivity, the noise in the output signal of the transistor is reduced to a level of about one-tenth that of previous field effect transistor.

It is, therefore, one object of the present invention to provide an improved field effect semiconductor device having a low level of noise in its output signal.

Another object is to provide a field effect transistor with a channel region having a subsurface portion of higher conductivity than its outer surface to reduce noise due to surface recombination of current carriers and other surface effects.

An additional object of the invention is to provide a PN junction gated field effect transistor having such a channel region formed by diffusion in which an oxide layer is provided on the outer surface of the channel to cause doping impurity to migrate from such surface into the oxide layer which is later removed to leave the outer surface with a lower impurity concentration than a subsurface portion of the channel.

BRIEF DESCRIPTION OF THE DRAWINGS

Other objects and advantages of the present invention will be apparent from the following detailed description of certain preferred embodiments thereof, and from the attached drawings of which.

DETAILED DESCRIPTION OF PREFERRED EMBODIMENTS

Figure 1:
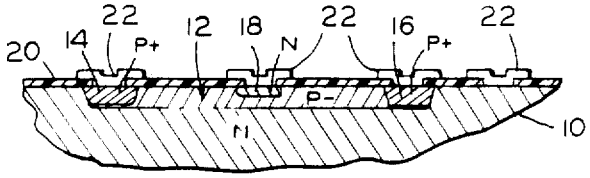
FIG. 1 is a sectional view of one embodiment of the field effect transistor of the present invention.

As shown in FIG. 1, one embodiment of the field effect semiconductor device of the present invention is a PN junction gated field effect transistor formed on a substrate member 10 of any suitable monocrystalline semiconductor material. The substrate member 10 may be made of N type silicon semiconductor material having a uniform concentration of phosphorous doping impurity. A channel region 12 of P-type silicon semiconductor material is formed by diffusing boron doping impurity into the substrate 10 to provide such channel with a subsurface portion of higher conductivity than its outer surface in a manner hereafter described. A source region 14 and a drain region 16 of P+ type silicon semiconductor material are also formed by diffusing more boron doping impurity into the channel region 12 at the opposite ends of such channel region. The source and drain form ohmic contacts with the channel. A top gate region 18 of N type silicon semiconductor material is formed by diffusing phosphorous doping impurity into the channel 12 at an intermediate position on the channel surface between the source and drain. The top gate region 18 forms a PN junction gate with the channel region which controls the flow of channel current between the source and drain in a conventional manner. An insulating layer of silicon dioxide 20 is provided over the outer surface of the channel portion 12 and the other portion of the upper surface of the substrate 10. A plurality of metal contacts 22 are provided through openings in the insulating layer 20 into contact with the source 14, drain 16, top gate 18, and the substrate 10. The substrate acts as the back gate electrode for the channel at the PN junction formed between such substrate and the channel. It should be noted that the back gate region 10 may also be provided by an epitaxial layer of uniform resistivity provided on a substrate member forming part of an integrated surface as shown in the above-mentioned co-pending U.S. Pat. application, Ser. No. 697,055 of Bresee.

Figure 4:
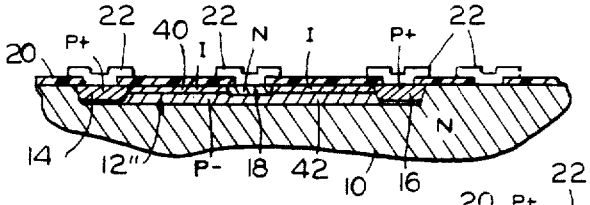
FIG. 4 is a sectional view of a third embodiment of the field effect transistor of the present invention.
Figure 2:
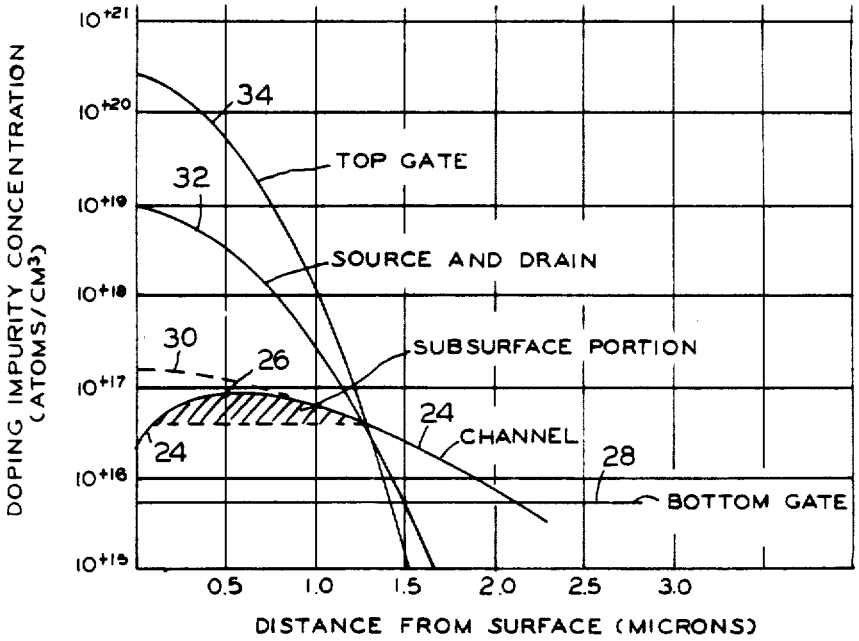
FIG. 2 is a diagram of the doping impurity concentration curves of the semiconductor regions in the field effect transistor of FIG. 1.

The method of manufacture of the field effect transistor of FIG. 1 may be similar to that shown in the above-mentioned patent application, Ser. No. 697,055, except for the formation of the channel region 12. As shown in FIG. 2, the channel region 12 has an impurity concentration curve 24 with an outer surface value of about $3 \times 10^{+16}$ atoms per cubic centimeter and increases to a peak value 26 of about $9 \times 10^{+16}$ atoms per cubic centimeter at a subsurface portion spaced at a distance of about 0.5 microns below the surface. The channel concentration curve 24 decreases in value from the peak point 26 to its minimum value of about $7 \times 10^{+15}$ atoms per cubic centimeter at the bottom of the channel approximately 2.1 microns from the surface. The bottom of the channel is determined by the intersection of such channel curve with a horizontal line 28 representing the uniform concentration of the back gate region 10 of about $7 \times 10^{+15}$ atoms per cubic centimeter. Thus, the subsurface channel portion 26 of highest conductivity is located at an intermediate position between the outer surface and the bottom of the channel. Normal diffusion of the channel would provide a concentration curve 30, shown in dash lines, which has a surface concentration of about $2 \times 10^{+17}$ atoms per cubic centimeter that is its portion of maximum conductivity. Curve 30 decreases continuously in concentration from its surface value to its portion of minimum conductivity at the bottom of the channel. However, in the present invention, some of the doping impurity is removed from the surface by migration from the channel surface into an oxide layer coated over such surface to leave the subsurface portion 26 of maximum conductivity. This migration is caused by heating the oxide coated semiconductor member 10 during the channel diffusion step. Thus, about five minutes after the start of the channel diffusion drive cycle, "wet" oxygen containing water vapor is introduced into the system which causes silicon oxide layer to form on the surface of the channel early in the diffusion. This oxide layer "getters" the boron doping impurity from the surface of the channel and causes the surface value of the impurity concentration curve to reduce from curve 30 to curve 24, as shown in FIG. 4. As a result, a subsurface portion of higher conductivity than the outer surface and having a peak value of 26 is formed in the channel spaced about 0.5 microns below the surface of such channel. This oxide layer is subsequently removed before the source, drain, and top gate regions are diffused into the channel.

As shown in FIG. 2, the diffused source and drain regions 14 and 16 having a concentration curve 32 which decreases from a surface value of about $10^{+19}$ atoms per cubic centimeter to the point where it intercepts the channel curve 24 at a value of approximately $6 \times 10^{+16}$ atoms per cubic centimeter about 1.25 microns from the surface of the channel at the bottom of the source and drain regions. Similarily, the top gate region 18 has a concentration curve 34 formed by diffusion which decreases from a surface value of about $4 \times 10^{+20}$ atoms per cubic centimeter to a minimum value of about $6 \times 10^{+16}$ atoms per cubic centimeter where it crosses the channel curve 24 so that the depth of the top gate region 18 is also about 1.25 microns. It should be noted that all of the elements of the field effect transistor except the back gate region 10 are formed by diffusion and that the channel region has an impurity concentration of lower surface value and lower average slope than any of the concentrations of the other diffusions. This provides the channel with a high resistance which is more uniform throughout its depth to enable the channel concentration to be more easily reproduced during production as set forth in the above-mentioned co-pending application.

Figure 3:
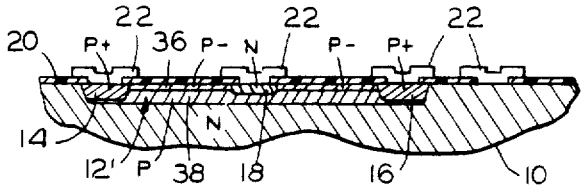
FIG. 3 is a sectional view of a second embodiment of the field effect transistor of the present invention.

Another embodiment of the field effect transistor of the present invention is shown in FIG. 3 which is similar to that of FIG. 1 so that the same reference numerals have been used to designate like parts. However, the channel portion 12' of the field effect transistor of FIG. 3 differs from that of FIG. 1 in that it is formed by an epitaxial outer layer 36 of P− type semiconductor material over a diffused layer 38 of P type semiconductor material. Thus, the epitaxial layer 36 of high resistance semiconductor material forms the outer surface of the channel region 12' so that a subsurface channel portion of highest conductivity is provided by the diffused layer 38. This subsurface portion is positioned at the junction between the bottom of the epitaxial layer 34 and the top of the diffused layer 38 because such diffused layer has a concentration curve similar to curve 30, in FIG. 2.

A third embodiment of the field effect transistor of the present invention is shown in FIG. 4. This embodiment is similar to that of FIG. 3 except that the channel region 12'' is provided with an I type intrinsic semiconductor layer 40 over a P type diffused layer 42. The intrinsic layer 40 is formed by diffusing N type impurities, such as phosphorous, into the surface of the P type diffused layer 42 until such N type impurities compensate for the P type impurities to form an intrinsic region of high resistivity. As a result, a subsurface portion of highest conductivity is provided in the channel region 12'' by the layer 42 at a position adjacent the junction between the bottom of the intrinsic region 40 and the top of the P type region 42.

Figure 5:
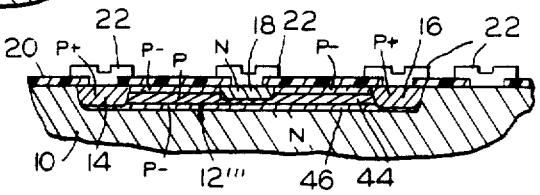
FIG. 5 is a sectional view of a fourth embodiment of the field effect transistor of the present invention.

FIG. 5 shows a fourth embodiment of the field effect transistor of the present invention which is similar to that of FIG. 1 except that the channel region 12''' is provided with an intermediate layer 44 of P+ type semiconductor material within a diffused P− type layer 46. The intermediate layer 44 is formed by ion implantation to provide a subsurface channel portion of highest conductivity. Thus, the implanted P+ type layer 44 is produced by bombarding the P− type layer 46 with ions of P type doping material which are accelerated to a high velocity so that they penetrate into the layer 44 and stop at a point beneath the surface of such layer.

It will be obvious to those having ordinary skill in the art that many changes may be made in the above-described details of the preferred embodiment of the present invention without departing from the spirit of the invention. Therefore, the scope of the present invention should only be determined by the following claims.

We claim:

1. In a field effect semiconductor device having a substrate of one conductivity type including source and drain regions of the other conductivity type and a channel portion of the other conductivity type extending between the source and drain regions with a gate electrode disposed thereon, the improvement comprising:

said channel portion having an outer surface on one side of said substrate, *a bottom portion*, and a subsurface portion of higher electrical conductivity relative to and spaced below said outer surface of said channel at an intermediate position between said outer surface and [the] *said* bottom *portion* of said channel for reducing the noise in the output signal of said device, *said subsurface portion having a doping impurity concentration which is several times greater than that of said outer surface and said bottom portion of said channel, said outer surface, said bottom portion, and said subsurface portion being of the same conductivity type* .

2. A semiconductor device in accordance with claim 1 which is a PN junction gated field effect transistor having at least one gate region of opposite type conductivity to said channel region forming a PN junction gate with said channel region.

3. A field effect transistor in accordance with claim 2 in which the channel region has a doping impurity concentration which increases from an intermediate value at the outer surface of the channel to a peak value in said subsurface portion of highest conductivity and decreases from said peak value to a minimum value at the bottom of said channel.

4. A field effect transistor in accordance with claim 3 in which said peak value is at least 0.5 microns below the surface of said channel.

5. A field effect transistor in accordance with claim 3 in which the surface impurity concentration of the channel is less than that of the source, drain or top gate regions of the transistor.

6. A field effect transistor in accordance with claim 2 in which the channel region contains a diffused doping impurity, a portion of which has been removed from the surface of said channel region to leave said subsurface portion of highest conductivity.

7. A field effect transistor in accordance with claim 5 in which the *channel* doping impurity is boron.

8. A field effect transistor in accordance with claim 2 in which the channel region includes an outer epitaxial layer of low conductivity over a diffused layer containing the subsurface portion of highest conductivity.

9. A field effect transistor in accordance with claim 2 in which the channel region has an outer surface layer of compensated intrinsic semiconductor material containing donor and acceptor doping impurities, over said subsurface portion.

10. A field effect transistor in accordance with claim 2 in which the subsurface portion of highest conductivity is provided by ion implanted doping impurities.

* * * * *

UNITED STATES PATENT AND TRADEMARK OFFICE

CERTIFICATE OF CORRECTION

PATENT NO. : RE. 28,500

DATED : July 29, 1975 Reissued

INVENTOR(S) : Heber J. Bresee and James L. Bowman

It is certified that error appears in the above-identified patent and that said Letters Patent are hereby corrected as shown below:

Column 1, line 57, "$10^{-15}$" should be --$10^{+15}$--;

Column 2, line 47, after "drain" insert --regions--;

Column 3, line 53, "having" should be --have--.

Signed and Sealed this

*second* Day of *December 1975*

[SEAL]

*Attest:*

RUTH C. MASON
*Attesting Officer*

C. MARSHALL DANN
*Commissioner of Patents and Trademarks*